(12) United States Patent
Varier et al.

(10) Patent No.: US 12,362,712 B2
(45) Date of Patent: Jul. 15, 2025

(54) CLASS AB MONTICELLI OUTPUT STAGE DESIGN WITH BIAS TEMPERATURE INSTABILITY TOLERANCE

(71) Applicant: TEXAS INSTRUMENTS INCORPORATED, Dallas, TX (US)

(72) Inventors: Vivek Varier, Tucson, AZ (US); Srinivas Kumar Pulijala, Tucson, AZ (US); Vadim Valerievich Ivanov, Tucson, AZ (US); Jerry L. Doorenbos, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 160 days.

(21) Appl. No.: 17/589,585

(22) Filed: Jan. 31, 2022

(65) Prior Publication Data
US 2023/0246605 A1    Aug. 3, 2023

(51) Int. Cl.
*H03F 3/30*        (2006.01)
*H03F 3/21*        (2006.01)

(52) U.S. Cl.
CPC ............ *H03F 3/21* (2013.01); *H03F 3/3022* (2013.01); *H03F 2203/21127* (2013.01)

(58) Field of Classification Search
CPC ............ H03F 3/21; H03F 3/3022; H03F 2203/21127; H03F 2200/447; H03F 2200/453; H03F 2203/30036; H03F 2203/30045; H03F 2203/30061; H03F 2203/30063; H03F 2203/30102; H03F 1/308

USPC .......................................... 330/264
See application file for complete search history.

(56) References Cited

U.S. PATENT DOCUMENTS

| 6,104,244 | A | * | 8/2000 | Gilbert ................. H03F 3/3067 330/267 |
| 7,920,027 | B2 | | 4/2011 | Keerti |
| 8,400,220 | B1 | * | 3/2013 | Joffe ...................... H03F 1/301 330/264 |

(Continued)

OTHER PUBLICATIONS

International Search Report in corresponding PCT Application No. PCT/US2023/011811, mailed May 9, 2023.

*Primary Examiner* — Andrea Lindgren Baltzell
*Assistant Examiner* — Khiem D Nguyen
(74) *Attorney, Agent, or Firm* — Mandy Barsilai Fernandez; Frank D. Cimino (57) ABSTRACT

In an example, a system includes an amplifier having an output stage configured to provide an output voltage, where the output stage includes a p-channel transistor and an n-channel transistor. The system includes a sense transistor having a gate coupled to a gate of the p-channel transistor, where the sense transistor is configured to sense a current of the p-channel transistor and produce a sense current. The system includes a current mirror coupled to the sense transistor and configured to provide the sense current to a gate of a control transistor, the control transistor having a source coupled to the gate of the p-channel transistor. The system includes a reference current source coupled to the control transistor and configured to provide a reference current. The control transistor is configured to adjust a gate current provided to the p-channel transistor based on comparing the sense current to the reference current.

20 Claims, 5 Drawing Sheets

(56) References Cited

U.S. PATENT DOCUMENTS

2011/0205193 A1    8/2011   Nishimura et al.
2020/0343868 A1   10/2020   Nakai

* cited by examiner

CLASS AB MONTICELLI OUTPUT STAGE DESIGN WITH BIAS TEMPERATURE INSTABILITY TOLERANCE

BACKGROUND

An output amplifier drives signals into an output load. In a class AB amplifier, two output stage transistors drive the load. Each of the output stage transistors conducts slightly more than half of the time. A Monticelli output stage includes floating current source devices coupled to the output stage transistors. A high-side translinear loop biases the high-side output stage transistor, and a low-side translinear loop biases the low-side output stage transistor.

SUMMARY

In accordance with at least one example of the description, a system includes an amplifier having an output stage configured to provide an output voltage, where the output stage includes a p-channel transistor and an n-channel transistor. The system also includes a sense transistor having a gate coupled to a gate of the p-channel transistor, where the sense transistor is configured to sense a current of the p-channel transistor and produce a sense current. The system includes a current mirror coupled to the sense transistor and configured to provide the sense current to a gate of a control transistor, the control transistor having a source coupled to the gate of the p-channel transistor. The system also includes a reference current source coupled to the control transistor and configured to provide a reference current, where the control transistor is further configured to adjust a gate current provided to the p-channel transistor based at least in part on a comparison of the sense current to the reference current.

In accordance with at least one example of the description, a system includes an amplifier having an output stage that includes a p-channel transistor and an n-channel transistor. The system also includes a first transistor having a gate coupled to a gate of the p-channel transistor and a first current mirror coupled to the first transistor. The system includes a second current mirror coupled to the first current mirror. The system also includes a reference current source coupled to the second current mirror. The system includes a second transistor having a gate coupled to the reference current source and the second current mirror, where the second transistor has a source coupled to the gate of the p-channel transistor.

In accordance with at least one example of the description, a method includes sensing a first current at a p-channel transistor, where the p-channel transistor provides an output voltage at an output stage of an amplifier. The method also includes providing a second current to a control transistor, where the second current is based at least in part on the first current, and where the control transistor includes a source coupled to a gate of the p-channel transistor. The method includes, responsive to the second current being less than a reference current, increasing the first current at the p-channel transistor with the control transistor.

BRIEF DESCRIPTION OF THE DRAWINGS

The same reference numbers or other reference designators are used in the drawings to designate the same or similar (functionally and/or structurally) features.

DETAILED DESCRIPTION

Over the lifetime of an electronic device, such as an amplifier, bias temperature instability (BTI) may occur. BTI is a device aging phenomenon that causes threshold voltage shifts over long periods of time in the presence of voltage stress at a gate of a transistor. A negative BTI (NBTI) is caused by positive charges becoming trapped at the oxide-semiconductor boundary underneath the gate of a metal-oxide-semiconductor field effect transistor (MOSFET). These positive charges partially cancel the negative gate voltage without contributing to conduction through the channel as electron holes in the semiconductor. After the gate voltage is removed, the trapped charges dissipate over a time period of milliseconds to hours. NBTI may cause an increase in the threshold voltage and decrease in the drain current and transconductance of a MOSFET. The degradation often occurs in PFETs (p-channel FETS), because they often operate with negative gate-to-source voltages. However, the same mechanism may also affect NFETs (n-channel FETS) when biased with a negative bias applied to the gate. NBTI and/or positive BTI (PBTI) may cause the threshold voltages of the transistors to shift from their initial values.

In examples herein, a precision output stage for an amplifier is described that is largely insensitive to BTI shifts. In a Monticelli output stage, as described below, the output stage p-channel MOS transistor (e.g., PMOS) tracks another PMOS within the floating current source. If a large amount of current is sourced through the output stage PMOS, or if the output stage PMOS has a large gate-to-source voltage ($V_{GS}$), a shift in the threshold voltage of the output stage PMOS may occur over time. Therefore, the two PMOS devices may no longer match as designed. If this occurs, the closed loop stability of the amplifier and the output current drive may be affected. The output stage quiescent current ($I_Q$) (e.g., the current through the output stage when it is not being driven) may also vary, such as by about 40%. Performance of the device may be degraded under these stress conditions, particularly at elevated temperatures (e.g., ambient temperatures and/or junction temperatures).

In examples herein, a sense device (such as a transistor) senses a fraction of the output current $I_Q$ of the Monticelli output stage. The sensed current is mirrored through the sense device and compared to a reference current. This dynamic tracking scheme includes a first loop that continually tracks the output current $I_Q$ and compares it to the reference current. To complete the first loop, a control transistor in parallel to the Monticelli floating current source ensures a certain minimum current for the output current $I_Q$. If the output current $I_Q$ decreases, the first loop activates and forces more current into the output stage. Further, if the output current $I_Q$ is above a certain threshold, the first loop does not activate and the circuit provides the advantages of the Monticelli output stage without added complexity. A second loop tracks the drain-to-source voltage ($V_{DS}$) of the output stage transistor. The output stage transistor and the sense transistor are designed/manufactured to have the same $V_{GS}$. If a threshold shift occurs in the output stage transistor, the sense device experiences the same threshold shift (e.g., a BTI shift) because the $V_{GS}$ of the two devices are the same. Therefore, the second loop may help improve current mirroring and help improve the match between the sense device and the output stage device. In examples herein, the sense device is a transistor, but any suitable device may be useful for sensing the output current.

Figure 1:
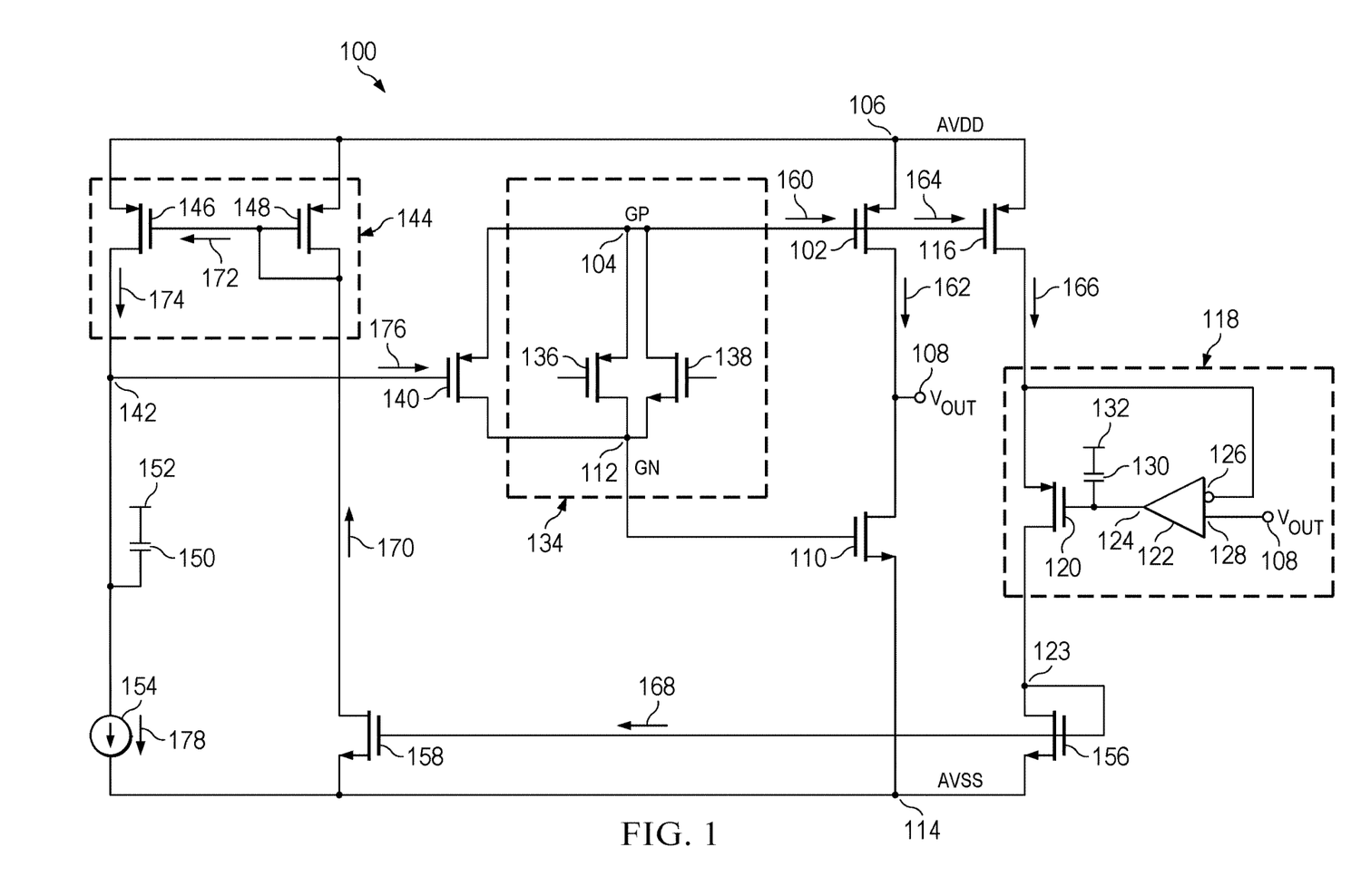
FIG. 1 is a circuit diagram of a system for bias temperature instability (BTI) tolerance in a class AB Monticelli output stage in accordance with various examples.

FIG. 1 is a circuit diagram of a system 100 for BTI tolerance in a class AB Monticelli output stage in accordance with various examples herein. System 100 includes a high-side output stage transistor PMOS 102. PMOS 102 includes a gate coupled to a node 104 (labeled GP because it is coupled to the gate of PMOS 102), a source coupled to a first voltage rail 106 (AVDD), and a drain coupled to an output node 108. AVDD may be a 5 V supply in one example. Other values may be used in other examples. System 100 also includes a low-side output stage transistor NMOS 110 (e.g., an n-channel MOS transistor). NMOS 110 includes a gate coupled to a node 112 (labeled GN because it is coupled to the gate of NMOS 110), a source coupled to a second voltage rail 114 (AVSS), and a drain coupled to output node 108. AVSS may be 0 V or ground in an example. Other values may be used in other examples.

System 100 includes a sense transistor 116 (e.g., a PMOS). Sense transistor 116 has a gate coupled to a gate of PMOS 102 and a source coupled to first voltage rail 106. Sense transistor 116 has a drain coupled to 2 118. Loop 2 118 includes a transistor 120. Transistor 120 is a PMOS transistor in this example. Transistor 120 includes a gate coupled to an amplifier 122, a source coupled to the drain of sense transistor 116, and a drain coupled to node 123. Amplifier 122 may be an operational amplifier in one example. Amplifier 122 includes an amplifier output 124, a first amplifier input 126, and a second amplifier input 128. First amplifier input 126 may be an inverting input of an amplifier. First amplifier input 126 is coupled to the source of transistor 120. Second amplifier input 128 is coupled to output node 108, where the output node 108 provides (as an input to amplifier 122) an output voltage $V_{OUT}$ of the Monticelli output stage of the amplifier of system 100. Second amplifier input 128 may be a non-inverting input of an amplifier. Also, in loop 2 118, a capacitor 130 is coupled to the gate of transistor 120 and to a voltage supply 132. Voltage supply 132 may be 5 V in one example. Capacitor 130 provides compensation for the loop to produce a suitable frequency response. Capacitor 130 helps to provide stability and control the dynamic performance of the loop.

System 100 also includes a floating current source 134. In this example, floating current source 134 includes a transistor 136 (e.g., a PMOS) and a transistor 138 (e.g., an NMOS) coupled between nodes 104 and 112. Floating current sources 134 may include other circuitry in other examples. In one example, the gates of transistors 136 and 138 may be coupled to other circuitry not shown in FIG. 1. Transistors 136 and 138 may be biased according to a standard Monticelli biasing scheme, which may bias the gates with a voltage that is approximately two diode voltage drops from a supply voltage rail (such as first voltage rail 106 or second voltage rail 114). A source of transistor 136 is coupled to node 104. A drain of transistor 136 is coupled to node 112. Transistor 136 may be a PMOS in one example. A source of transistor 138 is coupled to node 112. A drain of transistor 138 is coupled to node 104. Transistor 138 may be an NMOS in one example. Floating current sources 134 provide current for biasing PMOS 102 and NMOS 110, which allows for class AB operation of the output stage.

System 100 also includes transistor 140. Transistor 140 includes a gate coupled to node 142, a source coupled to node 104, and a drain coupled to node 112. Transistor 140 may be a PMOS in one example. Transistor 140 may be referred to as a control transistor herein. Transistor 140 is coupled in parallel to the floating current sources 134. As described below, if output current falls, transistor 140 provides more current to PMOS 102 to improve BTI tolerance of the output stage.

Transistor 140 is also coupled to current mirror 144. Current mirror 144 includes transistors 146 and 148. Transistor 146 has a source coupled to first voltage rail 106, a drain coupled to node 142, and a gate coupled to a gate of transistor 148. Transistor 148 has a source coupled to first voltage rail 106, and a drain coupled to its gate. The drain of transistor 146 is also coupled to capacitor 150, which is coupled to a voltage supply 152. Voltage supply 152 may be 5 V in one example. Reference current source 154 is coupled between the drain of transistor 146 and second voltage rail 114. Transistors 146 and 148 may be PMOS transistors in one example. As described below, reference current source 154 provides a current that is compared to the current sensed by sense transistor 116 to determine whether to increase the current provided to PMOS 102 to improve BTI tolerance of the output stage. Capacitor 150 provides compensation for the loop to produce a suitable frequency response. Capacitor 150 helps to provide stability and control the dynamic performance of the loop.

System 100 also includes another current mirror that includes transistors 156 and 158. Transistor 156 has a gate coupled to its drain at node 123 and also coupled to a gate of transistor 158. Transistor 156 has a source coupled to second voltage rail 114. Transistor 158 has a drain coupled to the drain of transistor 148 and a source coupled to second voltage rail 114. Transistors 156 and 158 may be NMOS transistors in one example.

A number of currents are also shown in system 100. Current 160 is the current provided to the gate of PMOS 102. Current 162 is the current provided by PMOS 102 to output node 108. Current 164 is the current provided to the gate of sense transistor 116. Current 166 is the current provided to transistors 120 and 156 from sense transistor 116. Current 168 is the current mirrored between transistors 156 and 158. Current 170 is the current provided to current mirror 144 from transistor 158. Current 172 is the current mirrored between transistors 148 and 146. Current 174 is the current provided to node 142 from transistor 146. Current 176 is the current provided to the gate of transistor 140. Reference current 178 is the current provided by reference current source 154. In an example, the first loop that provides feedback with respect to the output current 162 includes current 166, current 168, current 170, current 172, current 174, and current 176. That current path is referred to herein as the first loop.

In operation, system 100 may improve BTI tolerance by tracking the output stage current (e.g., current 162) and comparing that current to a reference (e.g., reference current 178). If the output stage current decreases, system 100 increases the current provided to PMOS 102 (e.g., current 160) via transistor 140, which raises the output stage current. Transistor 140 is configured to increase the current provided to PMOS 102 responsive to the first loop activating. In a class AB switching device, such as system 100, PMOS 102 sources current to the load while the current from NMOS 110 is minimal. If the operation switches, NMOS 110 sinks current from the load, while PMOS 102 provides a minimal current. In examples herein, the circuitry of system 100 regulates the current from PMOS 102 to at least a certain minimum current, which helps to compensate for BTI effects.

An example operation with sample current values is provided herein. First, an example output current (current 162) from PMOS 102 may be designed to be approximately 500 microamps (500 μA) if PMOS 102 is operating normally. If the mirror ratio between PMOS 102 and sense transistor 116 is 100:1, then the current 166 provided by sense transistor 116 is approximately 5 microamps (5 μA). The reference current 178 provided by reference current source 154 is approximately 4 microamps (4 μA) in this example. Current 166 is mirrored by the current mirror of transistors 156 and 158, and therefore current 170 is also approximately 5 microamps (5 μA). In this example, transistors 156 and 158 have a current mirror ratio of 1:1. Also in this example, transistors 146 and 148 have a current mirror ratio of 1:1. Because current 170 is approximately 5 microamps, currents 172 and 174 are also approximately 5 microamps, each. Because current 174 is approximately 5 microamps and the reference current 178 is approximately 4 microamps, the gate of transistor 140 (e.g., node 142) is pulled to a high voltage. In this scenario, where the sensed output current 166 (e.g., approximately 5 microamps) is greater than the reference current 178 (e.g., approximately 4 microamps), the first loop is cut off and transistor 140 does not turn on to provide additional current to PMOS 102.

If, in this example, output current 162 falls to approximately 300 microamps due to BTI effects, device aging, or other effects, then current 166 falls to approximately 3 microamps. The current 166 is mirrored by transistors 156 and 158, so current 170 is also approximately 3 microamps. Current mirror 144 mirrors the current 170, so current 174 is approximately 3 microamps. In this example, reference current 178 is approximately 4 microamps. Because reference current 178 is greater than current 174, node 142 is pulled down. Since node 142 is coupled to the gate of transistor 140, the $V_{GS}$ of transistor 140 increases. Therefore, more current is provided to PMOS 102 (current 160), and output current 162 increases. Hence, if output current 162 decreases, the first loop activates and increases output current 162 until output current 162 reaches a predetermined level, defined by the value of reference current 178. System 100 provides a dynamic tracking scheme that continually tracks the output current 162 and compares it to the reference current 178. The output current 162 may be kept above a predetermined level in system 100 with this dynamic tracking scheme. If output current 162 is above the predetermined level, the first loop remains inactive.

System 100 also includes loop 2 118. Loop 2 118 tracks the output voltage $V_{OUT}$ at output node 108. $V_{OUT}$ is provided to second amplifier input 128. Amplifier 122 is configured to hold the voltage at the drain of sense transistor 116 to a level approximately equal to $V_{OUT}$. Loop 2 118 ensures the $V_{DS}$ of sense transistor 116 and the VDS of PMOS 102 are similar. Similar $V_{DS}$'s may provide a more accurate current mirror between sense transistor 116 and PMOS 102.

Figure 2:
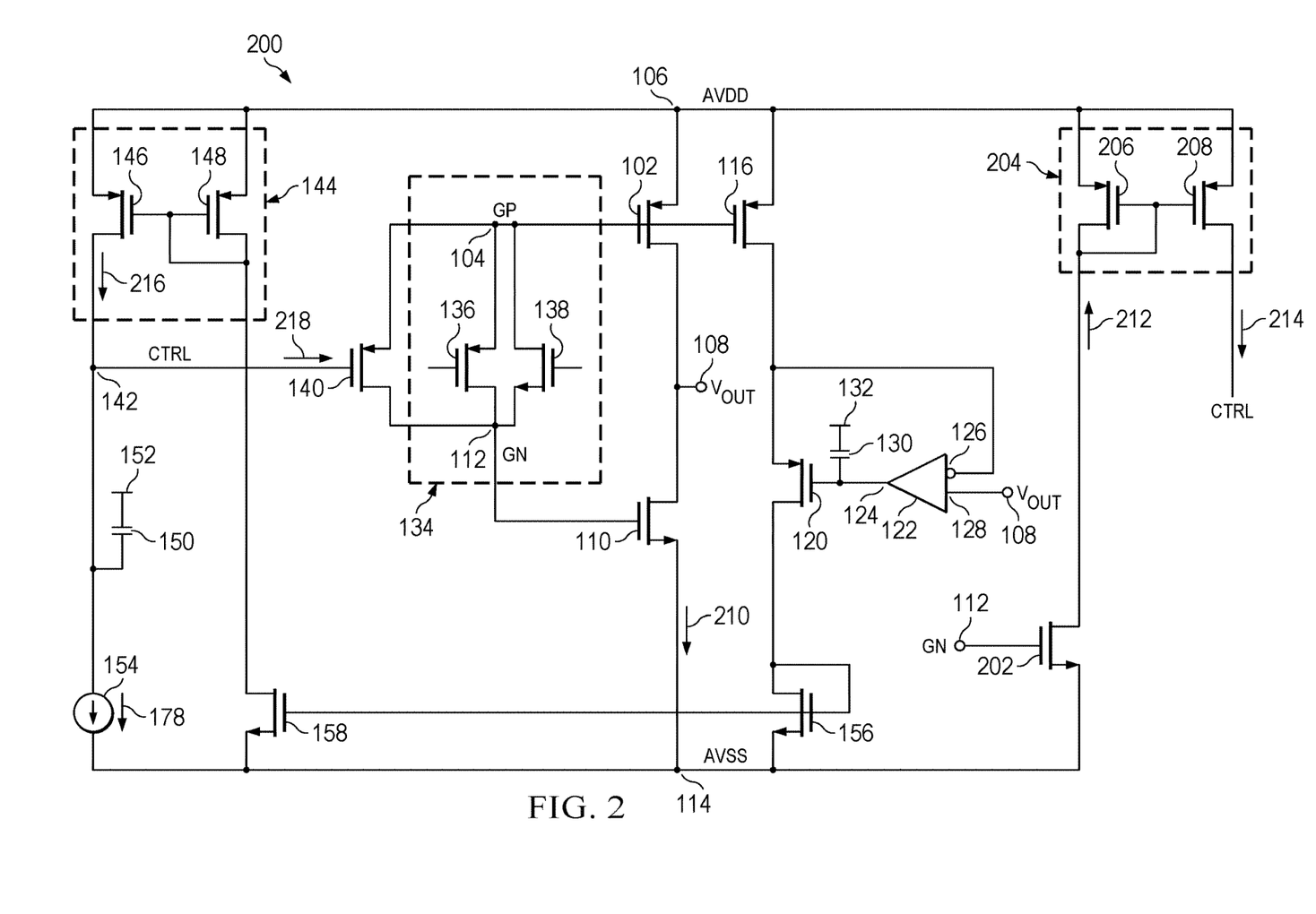
FIG. 2 is a circuit diagram of a system for BTI tolerance in a class AB Monticelli output stage in accordance with various examples.

FIG. 2 is a circuit diagram of a system 200 for BTI tolerance in a class AB Monticelli output stage in accordance with various examples herein. In FIG. 2, the same reference numbers or other reference designators are used as in FIG. 1 to designate the same or similar (functionally and/or structurally) features. The operation of the first loop and loop 2 118 are similar to their operation described above with respect to FIG. 1. Some of the currents shown in FIG. 1 are not shown in FIG. 2 for simplicity. In system 200, a second sense transistor (sense transistor 202) senses current from NMOS 110 and provides that current to transistor 140. This operation prevents the first loop from triggering while NMOS 110 is sinking current.

Sense transistor 202 includes a gate coupled to node 112 (GN), which is also coupled to the gate of NMOS 110. Sense transistor 202 has a source coupled to second voltage rail 114 and a drain coupled to current mirror 204. Sense transistor 202 may be an NMOS transistor in an example. Sense transistor 202 mirrors the current from NMOS 110, and may be smaller than NMOS 110 by a specific ratio, such as 100:1. Current mirror 204 includes transistor 206 and transistor 208. Transistor 206 has a gate coupled to its drain and coupled to a gate of transistor 208. Transistor 206 has a source coupled to first voltage rail 106. Transistor 208 has a source coupled to first voltage rail 106 and a drain coupled to node 142 (CTRL), which is coupled to the gate of transistor 140. Node 142 is labeled CTRL in FIG. 2, as transistor 140 is the control transistor described above with respect to FIG. 1. Transistors 206 and 208 may be PMOS transistors in an example.

System 200 also includes currents 210, 212, 214, and 216. Current 210 is the output current provided by NMOS 110 (e.g., NMOS current 210). Current 212 is current flowing through sense transistor 202, which is the mirrored copy of current 210, reduced by the transistor ratio between NMOS 110 and sense transistor 202. Current 214 is the mirrored version of current 212 that is provided by current mirror 204. Current 214 is provided to node 142. Also, reference current source 154 provides reference current 178 in this example. In some examples, reference current 178 in this example is twice the value of reference current 178 in FIG. 1.

In operation, sense transistor 202 operates similarly to sense transistor 116 as described above. Sense transistor 202 mirrors the current 210 through NMOS 110 to produce current 212. Current 212 is mirrored by current mirror 204 to produce current 214. The drain of transistor 208 is coupled to node 142, so current 214 is provided to current mirror 144. Current 214 is mirrored, and the mirrored current is shown as current 216. Current 218 is provided to the gate of transistor 140. Current 218 operates similarly to current 176 described above. If current 210 is below a predetermined threshold (e.g., a threshold set by reference current source 154), reference current 178 pulls down node 142 thereby increasing the current provided by transistor 140 and increasing current 210. If current 210 is above the predetermined threshold, the loop is inactive and the operation of transistor 140 is not changed. Therefore, in this example, a fraction of the NMOS current 210 is provided to transistor 140. Providing a fraction of this current 210 to transistor 140 prevents the first loop and transistor 140 from activating if NMOS 110 is sinking current, at which time PMOS 102 is producing a lower current.

Figure 3:
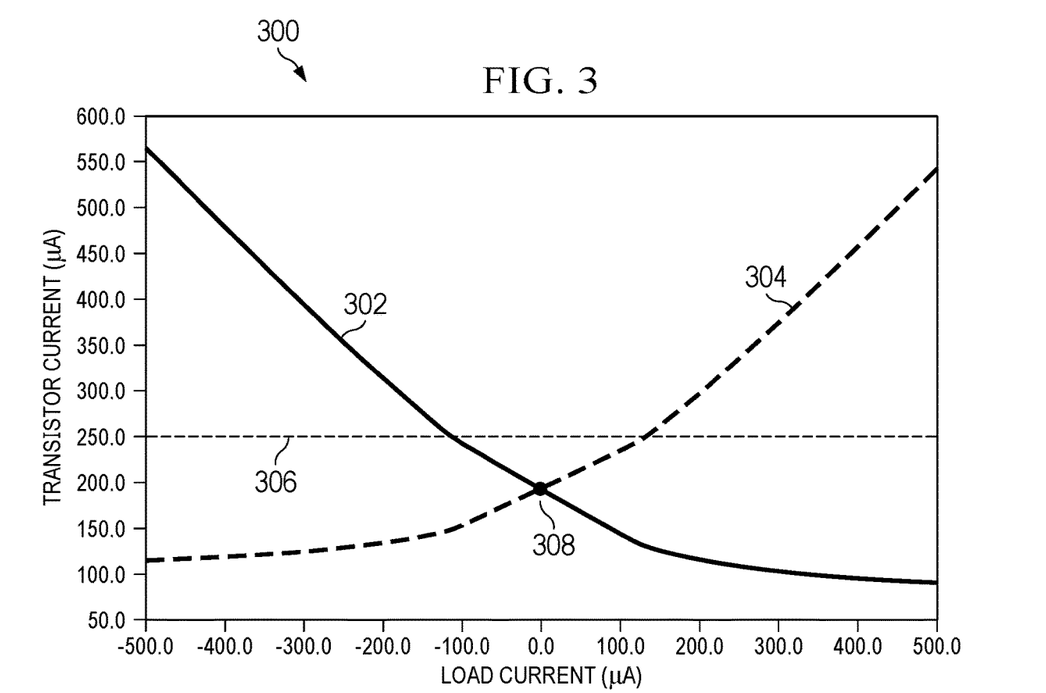
FIG. 3 is a graph of transistor currents in a class AB Monticelli output stage in accordance with various examples.

FIG. 3 is a graph 300 of transistor currents in a class AB Monticelli output stage in accordance with various examples herein. In graph 300, the x-axis represents the load current in microamps. The y-axis represents the current through the output stage transistors in microamps. Two curves are shown in graph 300. Curve 302 represents the current through the low-side output transistor NMOS 110 with respect to the load current. A load may be connected to output node 108, and the load current is the current through this load. Curve 304 represents the current through the high-side output transistor PMOS 102 with respect to the load current. Dashed line 306 represents a transistor current that indicates a threshold below which the first loop activates, as described above, and provides more current to the output stage (e.g., a reference current). Point 308 represents a quiescent value of the transistor currents if the load current is 0 microamps. In the example shown in graph 300, the quiescent value (point 308) is below the reference current (dashed line 306) due to aging artifacts in the circuit.

In simple class AB biasing, when the load sinks a large amount of current, the NMOS 110 provides the current to the load, as shown in the upper left portion of curve 302. On the left side of graph 300, the PMOS current (curve 304) is below the quiescent value at point 308. For the first loop as described above, the PMOS current (curve 304) is compared to the reference, and as the PMOS current rises, it may trigger the first loop. However, as described above with FIG. 2, the first loop does not need to be triggered while the NMOS 110 is providing the load current. Therefore, the third loop, as described above, prevents the first loop from triggering in this circumstance. The first loop only triggers if the current (e.g., curve 302) is below dashed line 306 (which represents a reference current), such as when the load current is between −100 and +100 microamps in this example.

In examples herein, the first loop does not trigger during a sinking condition (the left side of the graph, when curve 302 is high) and a sourcing condition (the right side of the graph, when curve 304 is high). The first loop triggers if the current is below the reference current. If the current is above the reference current (for example, if dashed line 306 was located at 100 microamps), the first loop does not trigger.

Due to threshold shifts, the quiescent value at point 308 may shift downward. However, the first loop triggers if the transistor current falls below dashed line 306, which raises the current. Therefore, the examples herein retain the qualities of the Monticelli solution, while only activating if there is a threshold shift caused by BTI or another issue. The examples herein therefore provide a dynamic correction scheme.

Figure 4:
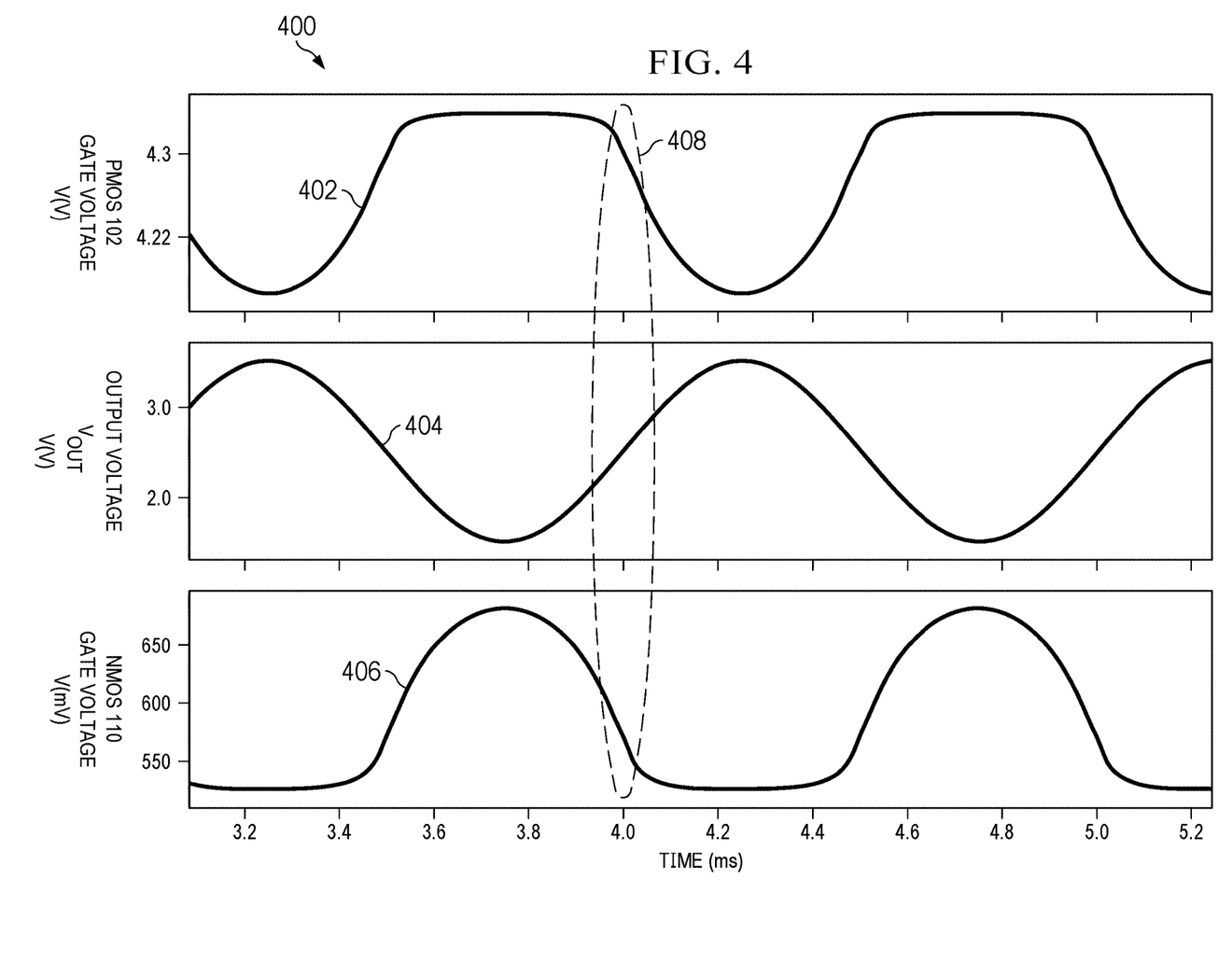
FIG. 4 is a collection of voltage waveforms in accordance with various examples.

FIG. 4 is a collection of voltage waveforms 400 in accordance with various examples herein. In this example, FIG. 4 shows voltage waveforms 400 for FIG. 2, where both the PMOS current 162 and the NMOS current 210 are provided to transistor 140 via feedback loops as described above. FIG. 4 shows an example of class AB switching. The various y-axes represent voltages, while the x-axis represents time in milliseconds (ms). In this example, the system operates at around 1 kilohertz (kHz), with a 1 kiloohm (kΩ) load and a voltage supply at around 5 V.

Waveform 402 is the gate voltage at PMOS 102. Waveform 404 is the output voltage $V_{OUT}$ at output node 108. Waveform 406 is the gate voltage at NMOS 110. Waveform 402 shows smooth transitions for the gate voltage of PMOS 102 as the first loop activates (e.g., as PMOS 102 gate voltage begins decreasing), such as near time 4.0 ms and time 5.0 ms. Location 408 is one example of where the loop may trigger.

Figure 5:
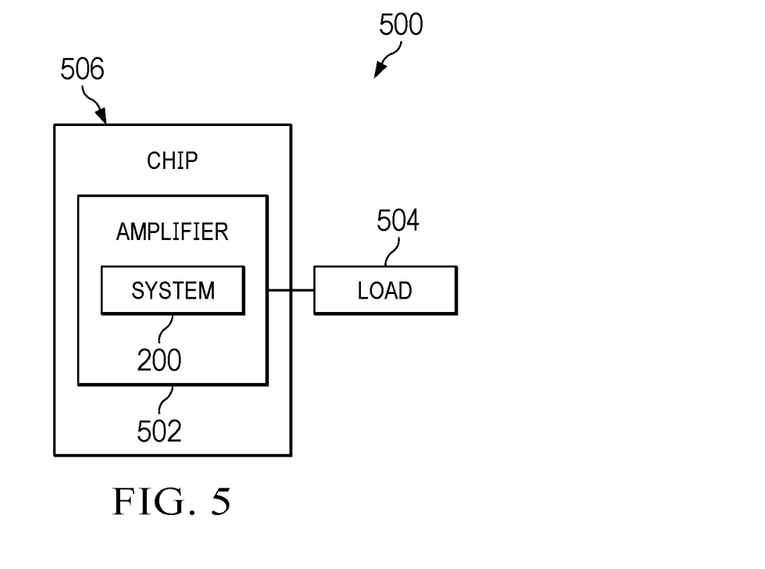
FIG. 5 is a system for BTI tolerance in an amplifier output stage in accordance with various examples.

FIG. 5 is a system 500 implementing BTI tolerance devices (such as ones described herein) in an amplifier output stage in accordance with various examples herein. System 500 includes an amplifier 502, a load 504, and a chip/integrated circuit 506. In this example, system 200 as described above is a component of amplifier 502. System 200 provides the NMOS current 210 and the PMOS current 162 to a control transistor, such as transistor 140, as described above. Amplifier 502 may be a class AB amplifier with a Monticelli output stage design in this example. In other examples, amplifier 502 may be a different type of amplifier. Load 504 is any load driven by amplifier 502. Chip 506 may be a singulated semiconductor substrate (e.g. a semiconductor chip), printed circuit board (PCB), package, or electronic device that includes system 200. In other examples, chip 506 may be a comparator, an analog-to-digital converter, a buffer, a driver, or any other system that includes system 200. System 200 operates as described above to provide robust lifetime performance for chip 506 that is largely insensitive to BTI shifts.

Figure 6:
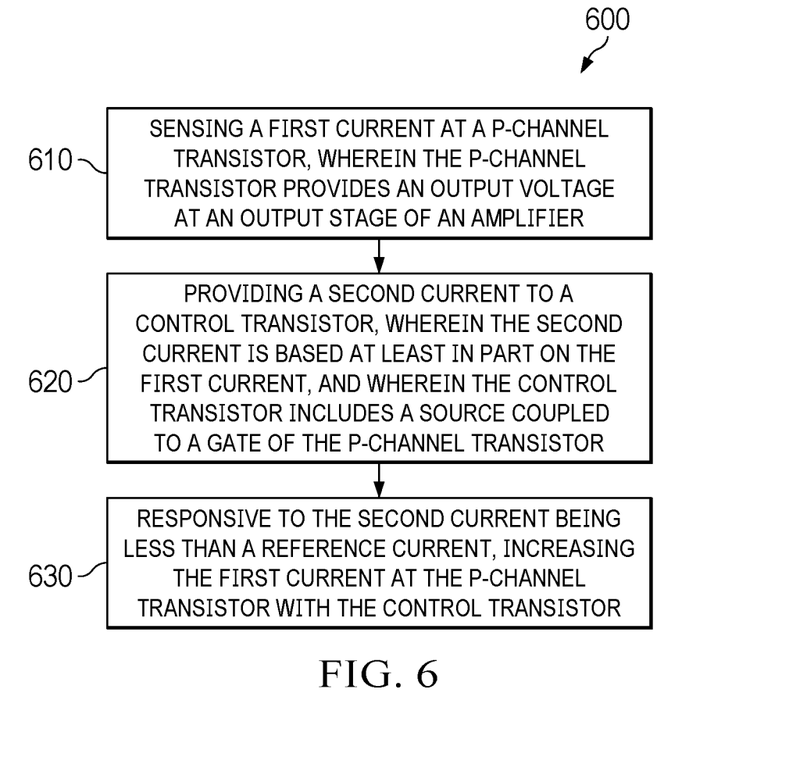
FIG. 6 is a flow diagram of a method for BTI tolerance in accordance with various examples.

FIG. 6 is a flow diagram of a method 600 for BTI tolerance in accordance with various examples herein. The steps of method 600 may be performed in any suitable order. The hardware components described above with respect to FIGS. 1-2 may perform method 600 in some examples.

Method 600 begins at 610, where a sense device, such as sense transistor 116, senses a first current at a p-channel transistor, where the p-channel transistor provides an output voltage at an output stage of an amplifier. P-channel transistor may be PMOS 102 in one example, and the first current is current 162. The output voltage $V_{OUT}$ is provided at output node 108 in an example.

Method 600 continue at 620, where a current mirror or other circuitry provides a second current to a control transistor, where the second current is based at least in part on the first current, and where the control transistor includes a source coupled to a gate of the p-channel transistor. In an example, the control transistor is transistor 140. The second current in an example is current 166, which is mirrored with a first loop and provided to transistor 140. In one example, currents 166, 168, 170, 172, 174, and 176 make up the first loop. In an example, sense transistor 116 is a scaled version of PMOS 102, and is configured to sense and mirror current 162 to produce current 166. Therefore, current 166 is a scaled version of current 162 and is based at least in part on current 162.

Method 600 continues at 630, where responsive to the second current being less than a reference current, transistor 140 increases the first current at the p-channel transistor. The currents and voltages at node 142 may vary based on the relative size of current 174 compared to reference current source 178. The comparison between these two currents drives the operation of transistor 140, which in turn adjusts the operation of PMOS 102. For example, if current 174 is less than reference current 178, node 142 is pulled down, which is coupled to the gate of transistor 140. Pulling down node 142 increase the $V_{GS}$ of transistor 140, and transistor 140 provides more current to the gate of PMOS 102. PMOS 102 therefore increases current 162. Responsive to the increase in current 162, the first loop provides an increased current to node 142 until current 174 is again greater than reference current 178, which reduces the $V_{GS}$ of transistor 140 and causes transistor 140 to return to its normal operation. The first loop therefore becomes idle until current 162 drops again below a predetermined threshold.

In some examples, other methods may include sensing a third current (e.g., current 210) at an n-channel transistor (e.g., NMOS 110), where the n-channel transistor provides the output voltage at the output stage of the amplifier. The method may also include providing a fourth current (e.g., current 218) to the control transistor (e.g., transistor 140), wherein the fourth current is based at least in part on the third current. The fourth current, in this example, is the mirrored version of current 210 provided by NMOS 110, which is mirrored by sense transistor 202. The third and fourth currents may be part of a loop that increases robustness of the class AB operation as described above with respect to FIG. 3.

In another example, another method may include sensing a drain-to-source voltage ($V_{DS}$) of the p-channel transistor (such as PMOS 102). The $V_{DS}$ may be sensed by a loop such as loop 2 118 in one example. The method may also include adjusting a drain-to-source voltage of a sense transistor (such as sense transistor 116) coupled to the p-channel transistor, where the drain-to-source voltage of the sense transistor is adjusted to approximately match the drain-to-source voltage of the p-channel transistor. As described above, loop 2 118 may perform this adjustment in one example. Loop 2 118 may improve the mirroring and tracking between an output transistor and a sense device without directly impacting the BTI solutions described above.

In examples herein, lifetime reliability of an output stage of an amplifier is improved with respect to BTI effects. One or more control loops as described above may sense output stage currents and regulate those currents to improve performance of the amplifier. The control loops are robust against lifetime BTI effects. Also, the principles described herein may be extended to any generic output stage bias design for improved lifetime performance. With a Monticelli output stage, the examples herein provide improved performance in light of BTI effects while also maintaining the advantages of a Monticelli output stage. Some examples described herein may provide improved performance in light of BTI effects, while remaining inactive if there are no BTI shifts.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component. While the use of particular transistors are described herein, other transistors (or equivalent devices) may be used instead with little or no change to the remaining circuitry. For example, a MOSFET (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs). While, in some examples, certain elements may be included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

What is claimed is:

1. A circuit comprising:
   a p-channel transistor having a gate, a source, and a drain;
   an n-channel transistor having a drain coupled to the drain of the p-channel transistor at an output of the circuit, the n-channel transistor having a gate and a source;
   a first transistor having first and second terminals and a control terminal, the control terminal coupled to the gate of the p-channel transistor, the first terminal coupled to the source of the p-channel transistor;
   first current mirror circuitry coupled to the second terminal of the first transistor;
   second current mirror circuitry coupled to the first current mirror circuitry, the second current mirror circuitry having a terminal;
   a second transistor having first and second terminals and a control terminal, the first terminal of the second transistor coupled to the gate of the p-channel transistor, the second terminal of the second transistor coupled to the gate of the n-channel transistor, the control terminal of the second transistor coupled to the terminal of the second current mirror circuitry; and
   a current source having a first terminal coupled to the terminal of the second current mirror circuitry and to the control terminal of the second transistor, the current source having a second terminal coupled to the source of the n-channel transistor.

2. The circuit of claim 1, further comprising third and fourth transistors coupled in parallel with the second transistor between the gates of the p-channel transistor and the n-channel transistor, wherein the third and fourth transistors are configured to be biased using a Monticelli biasing scheme for a class AB amplifier.

3. The circuit of claim 1, wherein the second transistor and the first transistor are p-channel transistors.

4. The circuit of claim 1, wherein the current source is a first current source, the circuit further comprising a second current source coupled in parallel with the second transistor between the gates of the p-channel transistor and the n-channel transistor.

5. The circuit of claim 1, further comprises:
   a third transistor having a control terminal coupled to the gate of the n-channel transistor and having a terminal coupled to the control terminal of the second transistor; and
   third current mirror circuitry coupling the terminal of the third transistor to the control terminal of the second transistor.

6. The circuit of claim 1, wherein:
   the first current mirror circuitry includes:
      a third transistor having first and second terminals and a control terminal, the first and control terminals of the third transistor coupled together and coupled to the second terminal of the first transistor, the second terminal of the third transistor coupled to the source of the n-channel transistor; and
      a fourth transistor having first and second terminals and a control terminal, the control terminal of the fourth transistor coupled to the control and first terminals of the third transistor, the second terminal of the fourth transistor coupled to the source of the n-channel transistor; and
   the second current mirror circuitry includes:
      a fifth transistor having first and second terminals and a control terminal, the second and control terminals of the fifth transistor coupled together and coupled to the first terminal of the fourth transistor, the first terminal of the fifth transistor coupled to the source of the p-channel transistor; and
      a sixth transistor having first and second terminals and a control terminal, the control terminal of the sixth transistor coupled to the control and second terminals of the fifth transistor, the first terminal of the sixth transistor coupled to the source of the p-channel transistor; the second terminal of the sixth transistor coupled to the control terminal of the second transistor and to the first terminal of the current source.

7. The circuit of claim 1, further comprising:
   an operational amplifier having a first input coupled to the second terminal of the first transistor and having a second input coupled to the output of the circuit.

8. The circuit of claim 7, further comprising:
   a third transistor having first and second terminals and a control terminal, the first terminal of the third transistor coupled to the second terminal of the first transistor, the second terminal of the third transistor coupled to the first current mirror circuitry, the control terminal of the third transistor coupled to an output of the operational amplifier.

9. A circuit comprising:
   a p-channel transistor having a gate, a source, and a drain;
   an n-channel transistor having a drain coupled to the drain of the p-channel transistor at an output of the circuit, the n-channel transistor having a gate and a source;
   a first transistor having first and second terminals and a control terminal, the control terminal of the first transistor coupled to the gate of the p-channel transistor, the first terminal coupled to the source of the p-channel transistor;
   a second transistor having first and second terminals and a control terminal, the first terminal of the second transistor coupled to the second terminal of the first transistor;
   first current mirror circuitry coupled to the second terminal of the second transistor;
   second current mirror circuitry coupled to the first current mirror circuitry, the second current mirror circuitry having a terminal;
   an operational amplifier having a first input coupled to the second terminal of the first transistor and to the first terminal of the second transistor, having a second input coupled to the output of the circuit, and having an output coupled to the control terminal of the second transistor;
   a current source having a first terminal coupled to the terminal of the second current mirror circuitry and having a second terminal coupled to the source of the n-channel transistor; and
   a third transistor having a control terminal coupled to the terminal of the second current mirror circuitry and to the first terminal of the current source, the third transistor having a first terminal coupled to the gate of the p-channel transistor and having a second terminal coupled to the gate of the n-channel transistor.

10. The circuit of claim 9, wherein the p-channel and n-channel transistors are part of a Monticelli output stage for a class AB amplifier.

11. The circuit of claim 9, wherein the current source is a first current source, the circuit further comprising a second current source coupled in parallel with the third transistor between the gates of the p-channel transistor and the n-channel transistor.

12. The circuit of claim 11, wherein the second current source includes a p-channel transistor and an n-channel transistor coupled in parallel with the second transistor.

13. The circuit of claim 9, wherein the p-channel transistor and the n-channel transistor are metal-oxide semiconductor field-effect transistors.

14. The circuit of claim 9, further comprising:
a fourth transistor having first and second terminals and a control terminal, the control terminal of the fourth transistor coupled to the gate of the n-channel transistor, the second terminal of the fourth transistor coupled to the source of the n-channel transistor; and
third current mirror circuitry having a first terminal coupled to the first terminal of the fourth transistor and having a second terminal coupled to the control terminal of the third transistor.

15. The circuit of claim 9, wherein:
the first current mirror circuitry includes:
a fourth transistor having first and second terminals and a control terminal, the first and control terminals of the fourth transistor coupled together and coupled to the second terminal of the second transistor, the second terminal of the fourth transistor coupled to the source of the n-channel transistor; and
a fifth transistor having first and second terminals and a control terminal, the control terminal of the fifth transistor coupled to the control and first terminals of the fourth transistor, the second terminal of the fifth transistor coupled to the source of the n-channel transistor; and
the second current mirror circuitry includes:
a sixth transistor having first and second terminals and a control terminal, the second and control terminals of the sixth transistor coupled together and coupled to the first terminal of the fifth transistor, the first terminal of the sixth transistor coupled to the source of the p-channel transistor; and
a seventh transistor having first and second terminals and a control terminal, the control terminal of the seventh transistor coupled to the control and second terminals of the sixth transistor, the first terminal of the seventh transistor coupled to the source of the p-channel transistor; the second terminal of the seventh transistor coupled to the control terminal of the third transistor and to the first terminal of the current source.

16. A circuit comprising:
a p-channel transistor having a gate, a source, and a drain;
an n-channel transistor having a drain coupled to the drain of the p-channel transistor at an output of the circuit, the n-channel transistor having a gate and a source;
a first transistor having first and second terminals and a gate, the gate of the first transistor coupled to a gate of the p-channel transistor, the first terminal coupled to the source of the p-channel transistor;
first current mirror circuitry coupled to the second terminal of the first transistor;
second current mirror circuitry coupled to the first current mirror circuitry, and having a terminal;
a second transistor having first and second terminals and a control terminal, the control terminal of the second transistor coupled to the terminal of the second current mirror circuitry, the first terminal of the second transistor coupled to the gate of the p-channel transistor, the second terminal of the second transistor coupled to the gate of the n-channel transistor;
a current source having a first terminal coupled to the terminal of the second current mirror circuitry and to the gate of the second transistor and having a second terminal coupled to the source of the n-channel transistor; and
a third transistor having a gate coupled to a gate of the n-channel transistor and having first and second terminals, the first terminal of the third transistor coupled to control terminal of the second transistor, the second terminal of the third transistor coupled to the source of the n-channel transistor.

17. The circuit of claim 16, further comprising:
an operational amplifier having first and second inputs and an output, the first input coupled to the second terminal of the first transistor, the second input coupled to the output of the circuit; and
a fourth transistor having a control terminal coupled to the output of the operational amplifier, having a first terminal coupled to the second terminal of the first transistor, and having a second terminal coupled to the first current mirror circuitry.

18. The circuit of claim 17, further comprising third current mirror circuitry coupling the first terminal of the third transistor to the control terminal of the second transistor.

19. The circuit of claim 16, further comprising fourth and fifth transistors coupled in parallel with the second transistor between the gates of the p-channel transistor and the n-channel transistor.

20. The circuit of claim 16, wherein the p-channel transistor is a field-effect transistor (FET), and the first and second transistors are p-channel FETs.

* * * * *